United States Patent
Ding

(10) Patent No.: US 8,125,254 B1
(45) Date of Patent: Feb. 28, 2012

(54) TECHNIQUES FOR CONFIGURING MULTI-PATH FEEDBACK LOOPS

(75) Inventor: Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 54 days.

(21) Appl. No.: 12/613,465

(22) Filed: Nov. 5, 2009

(51) Int. Cl.
*H03L 7/06* (2006.01)

(52) U.S. Cl. ........ 327/156; 327/147; 327/148; 327/149; 327/157; 327/158; 331/10; 331/17; 331/18; 331/32; 375/374; 375/376

(58) Field of Classification Search .......... 327/146–150, 327/155–159, 161–163; 331/1 R, 10, 17, 331/18, 32, 34, 1 A; 375/373–376
See application file for complete search history.

(56) References Cited

U.S. PATENT DOCUMENTS

| | | | |
|---|---|---|---|
| 5,740,213 A | 4/1998 | Dreyer | |
| 5,880,612 A | 3/1999 | Kim | |
| 6,242,956 B1 * | 6/2001 | McCollough et al. | 327/159 |
| 6,326,826 B1 | 12/2001 | Lee et al. | |
| 6,366,148 B1 | 4/2002 | Kim | |
| 6,538,519 B2 | 3/2003 | Lo et al. | |
| 6,993,300 B2 | 1/2006 | Luo et al. | |
| 7,019,571 B2 | 3/2006 | Lim | |
| 7,091,759 B2 | 8/2006 | Sowlati et al. | |
| 7,315,214 B2 * | 1/2008 | Badets et al. | 331/11 |
| 7,345,550 B2 | 3/2008 | Bellaouar et al. | |
| 7,443,249 B2 * | 10/2008 | Song | 331/17 |
| 2008/0001657 A1 | 1/2008 | Zhang | |
| 2009/0085679 A1 | 4/2009 | Jennings et al. | |

* cited by examiner

*Primary Examiner* — Patrick O'Neill
(74) *Attorney, Agent, or Firm* — Steve J. Cahill

(57) ABSTRACT

In some embodiments, a feedback loop circuit includes a phase detector, first and second charge pumps that are each coupled to receive an output signal of the phase detector, a first low pass filter, a second low pass filter coupled to an output of the second charge pump, a clock signal generation circuit having first and second control inputs, a first switch circuit coupled between the first low pass filter and the second low pass filter, and a second switch circuit coupled to the first low pass filter and the first control input of the clock signal generation circuit.

22 Claims, 5 Drawing Sheets

TECHNIQUES FOR CONFIGURING MULTI-PATH FEEDBACK LOOPS

BACKGROUND

The present invention relates to electronic circuits, and more particularly, to techniques for configuring multi-path feedback loops.

A phase-locked loop (PLL) can be used to generate clock signals. A PLL typically includes a phase detector that compares a reference clock signal to a feedback clock signal to generate one or more phase error signals. A charge pump generates a control voltage based on the phase error signals. A loop filter filters the control voltage. A voltage-controlled oscillator generates one or more output clock signals. The frequency of the output clock signals of the oscillator varies based on changes in the filtered control voltage.

A PLL typically introduces jitter peaking into its output clock signals. Jitter peaking is caused by the closed loop jitter transfer function of the PLL exceeding unity within a range of frequencies. The jitter in the reference clock signal is amplified within this range of frequencies, causing more jitter in the output clock signals than exists in the reference clock signal. Jitter peaking can be a problem in systems that have several PLLs cascaded together in series such that an output clock signal of each PLL (except the last PLL) is used to generate the reference clock signal for the next PLL in the series.

BRIEF SUMMARY

According to some embodiments, a feedback loop circuit includes a phase detector, first and second charge pumps that are each coupled to receive an output signal of the phase detector, a first low pass filter, a second low pass filter coupled to an output of the second charge pump, a clock signal generation circuit having first and second control inputs, a first switch circuit coupled between the first low pass filter and the second low pass filter, and a second switch circuit coupled to the first low pass filter and the first control input of the clock signal generation circuit.

According to other embodiments, a feedback loop circuit includes a phase detector, first and second charge pumps that are each coupled to receive an output signal of the phase detector, a first low pass filter, a second low pass filter coupled to an output of the second charge pump, and a clock signal generation circuit having first and second control inputs. The output of the second charge pump is coupled to the second control input of the clock signal generation circuit and an output of the first charge pump is coupled to the first low pass filter and to the first control input of the clock signal generation circuit when the feedback loop circuit is configured to function as a dual path feedback loop. The output of the first charge pump is decoupled from the clock signal generation circuit when the feedback loop circuit is configured to function as a single path feedback loop.

Various objects, features, and advantages of the present invention will become apparent upon consideration of the following detailed description and the accompanying drawings.

DETAILED DESCRIPTION

Figure 1:
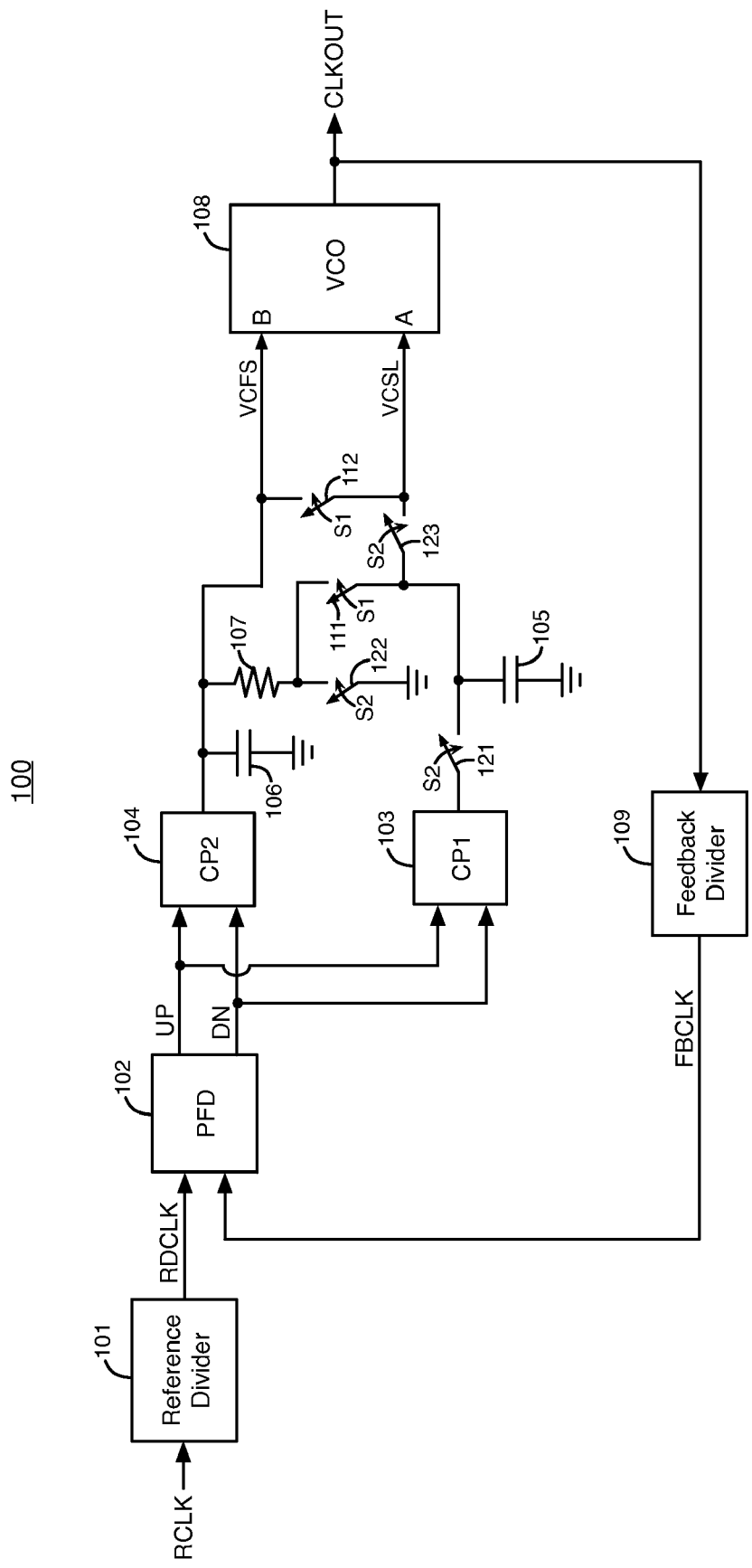
FIG. 1 illustrates an example of a configurable dual path phase-locked loop (PLL) circuit, according to an embodiment of the present invention.

FIG. 1 illustrates an example of a configurable dual path phase-locked loop (PLL) circuit 100, according to an embodiment of the present invention. PLL 100 generates an output clock signal CLKOUT that has low jitter peaking relative to a reference clock signal RCLK.

PLL 100 includes a reference frequency divider circuit 101, a phase frequency detector (PFD) 102, a first charge pump (CP1) 103, a second charge pump (CP2) 104, capacitors 105-106, resistor 107, voltage-controlled oscillator (VCO) 108, feedback frequency divider circuit 109, and switch circuits 111-112 and 121-123.

PLL 100 is typically fabricated on an integrated circuit. A PLL can, for example, be fabricated on an application specific integrated circuit (ASIC) or on a programmable logic integrated circuit, such as a field programmable gate array (FPGA).

A reference clock signal RCLK is transmitted to an input of reference frequency divider circuit 101. Reference frequency divider 101 divides the frequency of clock signal RCLK by a positive integer N to generate an output clock signal RDCLK. RDCLK has a frequency that is a fraction of the frequency of RCLK. The frequency of RCLK divided by the frequency of RDCLK equals N.

Clock signal RDCLK is transmitted to a first input of phase frequency detector (PFD) circuit 102. PFD 102 compares the phase and the frequency of clock signal RDCLK to the phase and the frequency of a feedback clock signal FBCLK. PFD 102 generates pulses in UP and DN output phase error signals that vary in duration based on the difference between the phases of RDCLK and FBCLK. The UP and DN signals are transmitted to inputs of charge pumps 103 and 104.

PLL 100 has two separate signal paths from the outputs of PFD 102 to VCO 108. The two signal paths are an integral path and a proportional path. The integral path includes charge pump 103 and capacitor 105. The proportional path includes charge pump 104, capacitor 106, and resistor 107. Capacitor 106 and resistor 107 are both coupled to the output of charge pump 104.

PLL 100 has 6 switch circuits 111-112 and 121-123. Switch circuit 121 is coupled between the output of charge pump 103 and capacitor 105. Switch circuit 122 is coupled between resistor 107 and ground. Switch circuit 111 is coupled between resistor 107 and capacitor 105. Switch circuit 123 is coupled between capacitor 105 and the A input of VCO 108. Switch circuit 112 is coupled between the output of charge pump 104 and the A input of VCO 108.

The conductive states of switch circuits 111-112 are controlled by switch control signal S1. The conductive states of switch circuits 121-123 are controlled by switch control signal S2. Switch control signals S1 and S2 are driven to opposite logic states.

PLL 100 can be configured as a single path PLL or as a dual path PLL. The conductive states of switch circuits 111-112 and 121-123 determine whether PLL 100 is configured as a single path PLL or a dual path PLL.

When switch control signal S1 is in a logic high state, and switch control signal S2 is in a logic low state, switch circuits 111-112 are closed (i.e., in conductive states), switch circuits 121-123 are open (i.e., in non-conductive states), and PLL 100 is configured as a single path PLL. PLL 100 has only one path through its feedback loop when PLL 100 is configured as a single path PLL. The output of charge pump 104 is coupled to the B input of VCO 108. The output of charge pump 104 is also coupled to the A input of VCO 108 through switch circuit 112. Resistor 107 is coupled to capacitor 105 through switch circuit 111. The output of charge pump 103 is decoupled from capacitor 105. Resistor 107 is decoupled from ground. The path through charge pump 104 is enabled to drive VCO 108 in single path PLL mode. The path through charge pump 103 is disabled.

When PLL 100 is configured as a single path PLL, the filtered output control voltage of charge pump 104 drives both the A and B inputs of VCO 108. The operation of PLL 100 is now described for when PLL 100 is configured as a single path PLL. When the frequency of input clock signal RDCLK is greater than the frequency of feedback clock signal FBCLK, PFD 102 causes charge pump 104 to increase its output control voltage. VCO 108 generates an output clock signal CLKOUT. When the output control voltage of charge pump 104 increases, VCO 108 increases the frequency of its output clock signal CLKOUT.

Feedback frequency divider 109 divides the frequency of clock signal CLKOUT by a positive integer M to generate the feedback clock signal FBCLK. FBCLK has a frequency that is a fraction of the frequency of CLKOUT. The frequency of CLKOUT divided by the frequency of FBCLK equals M. Thus, when the frequency of CLKOUT increases, the frequency of FBCLK also increases.

When the frequency of FBCLK is greater than the frequency of RDCLK, PFD 102 causes charge pump 104 to decrease its output control voltage. When the output control voltage of charge pump 104 decreases, the frequency of the output clock signal CLKOUT of VCO 108 decreases, which causes the frequency of FBCLK to decrease. When FBCLK and RDCLK have the same frequency and are aligned in phase, PFD 102 causes charge pump 104 to maintain its output control voltage at a constant voltage. When the output control voltage of charge pump 104 is constant, the frequencies of CLKOUT and FBCLK remain constant. When configured as a single path PLL, PLL 100 varies the frequency and the phase of FBCLK until FBCLK and RDCLK are aligned in phase and have the same frequency. The gain of VCO 108 is $K_{VCO}=K_{VCO1}+K_{VCO2}$, where $K_{VCO1}$ is the VCO gain based on the control voltage at the A input, and $K_{VCO2}$ is the VCO gain based on the control voltage at the B input.

When switch control signal S1 is in a logic low state, and switch control signal S2 is in a logic high state, switch circuits 111-112 are open (i.e., in non-conductive states), switch circuits 121-123 are closed (i.e., in conductive states), and PLL 100 is configured as a dual path PLL. The output of charge pump 104 is coupled to the B input of VCO 108. The output of charge pump 103 is coupled to the A input of VCO 108 through switch circuits 121 and 123. Resistor 107 is coupled to ground through switch circuit 122. Switch circuit 112 decouples the A and B control inputs of VCO 108 from each other, and switch circuit 111 decouples resistor 107 from capacitor 105. When PLL 100 is configured as a dual path PLL, the integral path through charge pump 103 drives the A input of VCO 108, and the proportional path through charge pump 104 drives the B input of VCO 108.

The operation of PLL 100 is now described for when PLL 100 is configured as a dual path PLL. Capacitor 105 functions as a low pass filter for the integral path. The transfer function of the low pass filter formed by capacitor 105 equals $K_{LF1}=1/(j\omega C_{105})$, where $C_{105}$ is the capacitance of capacitor 105. Capacitor 106 and resistor 107 function as a low pass filter for the proportional path. The transfer function of the low pass filter formed by capacitor 106 and resistor 107 equals $K_{LF2}=R_{107}/(j\omega C_{106}R_{107}+1)$, where $C_{106}$ is the capacitance of capacitor 106, and $R_{107}$ is the resistance of resistor 107.

Capacitor 105 is larger than capacitor 106, and charge pump 104 generates a larger output current than charge pump 103. As a result, the integral path is a slow signal path, and the proportional path is a fast signal path.

For example, capacitor 105 may be 60 picofarads (pF), capacitor 106 may be 5 pF, charge pump 103 may generate an output current of 5 or 10 microamps ($\mu A$), and charge pump 104 may generate an output current of 200 $\mu A$. These example values are provided for the purpose of illustration and are not intended to limit the scope of the present invention to these particular values.

Charge pump 103 generates a slow response control voltage VCSL in response to the UP and DN signals generated by PFD 102. Charge pump 103 adds charge to capacitor 105 in response to each pulse in the UP signal. Charge pump 103 drains charge from capacitor 105 in response to each pulse in the DN signal.

Charge pump 104 generates a fast response control voltage VCFS in response to the UP and DN signals. Charge pump 104 adds charge to capacitor 106 in response to each pulse in the UP signal. Charge pump 104 drains charge from capacitor 106 in response to each pulse in the DN signal.

The control voltages VCSL and VCFS are provided to the A and B inputs of VCO 108, respectively. VCO 108 varies the frequency of its output clock signal CLKOUT in response to changes in the control voltages VCSL and VCFS.

PFD 102 generates logic high pulses in the UP signal that are longer than the logic high pulses in the DN signal when the frequency of input clock signal RDCLK is greater than the frequency of feedback clock signal FBCLK. When logic high pulses in the UP signal are longer than logic high pulses in the DN signal, charge pumps 103 and 104 increase control voltages VCSL and VCFS, respectively. When VCSL and VCFS increase, the frequency of the output clock signal CLKOUT of VCO 108 increases, which causes the frequency of FBCLK to increase. Charge pumps 103 and 104 increase voltages VCSL and VCFS by sending charge to capacitors 105 and 106, respectively.

PFD 102 generates logic high pulses in the DN signal that are longer than the logic high pulses in the UP signal when the frequency of feedback clock signal FBCLK is greater than the frequency of input clock signal RDCLK. When logic high pulses in the DN signal are longer than logic high pulses in the UP signal, charge pumps 103 and 104 decrease control voltages VCSL and VCFS, respectively. When VCSL and VCFS decrease, the frequency of the output clock signal CLKOUT of VCO 108 decreases, which causes the frequency of FBCLK to decrease. Charge pumps 103 and 104 decrease voltages VCSL and VCFS by draining charge from capacitors 105 and 106, respectively.

When input clock signal RDCLK and feedback clock signal FBCLK are aligned in phase and have the same frequency, PFD 102 generates logic high pulses in the UP signal that have the same duration as logic high pulses in the DN signal. When the pulses in the UP and DN signals have the same duration, charge pumps 103 and 104 maintain control voltages VCSL and VCFS, respectively, at constant voltages.

When VCSL and VCFS are constant, VCO 108 maintains the frequency of CLKOUT at a constant value. The frequency of FBCLK is constant when the frequency of CLKOUT is constant. PLL 100 is in lock when input clock signal RDCLK and feedback clock signal FBCLK have the same (or about the same) frequency and are aligned in phase.

The gain $K_{VCO1}$ of VCO 108 that is provided by the integral path through charge pump 103 is larger than the gain $K_{VCO2}$ of VCO 108 that is provided by the proportional path through charge pump 104. For example, $K_{VCO1}$ may equal 1.5 GHz/V, and $K_{VCO2}$ may equal 500 MHz/V. This example is provided for the purpose of illustration and is not intended to limit the scope of the present invention.

When the frequencies of clock signals RDCLK and FBCLK are relatively far apart, charge pump 104 varies the voltage of VCFS more than charge pump 103 varies the voltage of VCSL, and variations in the frequency of CLKOUT are predominately caused by changes in VCFS. When the frequency of clock signal FBCLK is closer to the frequency of clock signal RDCLK, charge pump 103 varies the voltage of VCSL more than charge pump 104 varies the voltage of VCSF, and variations in the frequency of CLKOUT are predominately caused by changes in VCSL. When PLL 100 is in lock, current through resistor 107 in the proportional path reduces any noise on control voltage VCFS, which reduces jitter in CLKOUT.

The gain of the integral path $K_{IP}=I_{CP103} \times K_{LF1} \times K_{VCO1}/(2\pi)$, where $I_{CP103}$ equals the output current of charge pump 103. The gain of the proportional path $K_{PP}=I_{CP104} \times K_{LF2} \times K_{VCO2}/(2\pi)$, where $I_{CP104}$ equals the output current of charge pump 104. By reducing the capacitance of capacitor 105 and by scaling the output current of charge pump 103, a vary narrow jitter bandwidth can be achieved in the integral path of PLL 100.

The dual path PLL 100 of FIG. 1 reduces jitter peaking in the output clock signal CLKOUT relative to the reference clock signal RCLK compared to conventional single path PLL designs. Equation (1) below shows a proportionality relationship that applies to the jitter peaking in PLL 100.

$$\text{Jitter Peaking} \propto \frac{C_{105}}{C_{106}} \times \frac{I_{CP103}}{I_{CP104}} \qquad (1)$$

In equation (1), $C_{105}$ is the capacitance of capacitor 105, $C_{106}$ is the capacitance of capacitor 106, $I_{CP103}$ is the output current of charge pump 103, and $I_{CP104}$ is the output current of charge pump 104. The jitter peaking that PLL 100 generates in output clock signal CLKOUT and in an inverse clock signal CLKOUTB can be suppressed by causing the ratio of the charge pump currents $I_{CP103}/I_{CP104}$ to be large. The jitter peaking that PLL 100 generates in output clock signals CLKOUT and CLKOUTB can also be suppressed by increasing the capacitance of capacitor 105.

As an example, the jitter peaking of PLL 100 is 1.61 dB, if the capacitance of capacitor 105 is selected to be 50 pF. As another example, the jitter peaking of PLL 100 is 0.27 dB, if the capacitance of capacitor 105 is selected to be 200 pF. As yet another example, the jitter peaking of PLL 100 may be less than 0.1 dB as required by SONET applications, if capacitor 105 is selected to have a larger capacitance. The jitter peaking of PLL 100 is substantially reduced compared to conventional single path PLLs that have the same size loop filter capacitor as capacitor 105. In many applications, capacitor 105 can be designed to be small enough to fit on the same integrated circuit die as PLL 100 while providing reduced jitter peaking in CLKOUT relative to single path PLLs.

When PLL 100 is configured as a dual path PLL, the integral path has wider tuning range compared to the proportional path. The single path PLL and the dual path PLL may have a similar frequency tuning range. In addition, PLL 100 can be used as a clock clean-up PLL that provides less jitter in a clock signal, because the jitter bandwidth of the dual path PLL 100 is reduced (e.g., by 2 times) compared to a single path PLL when PLL 100 has a capacitor 105 that has the same capacitance as a loop filter in the single path PLL.

Figure 2:
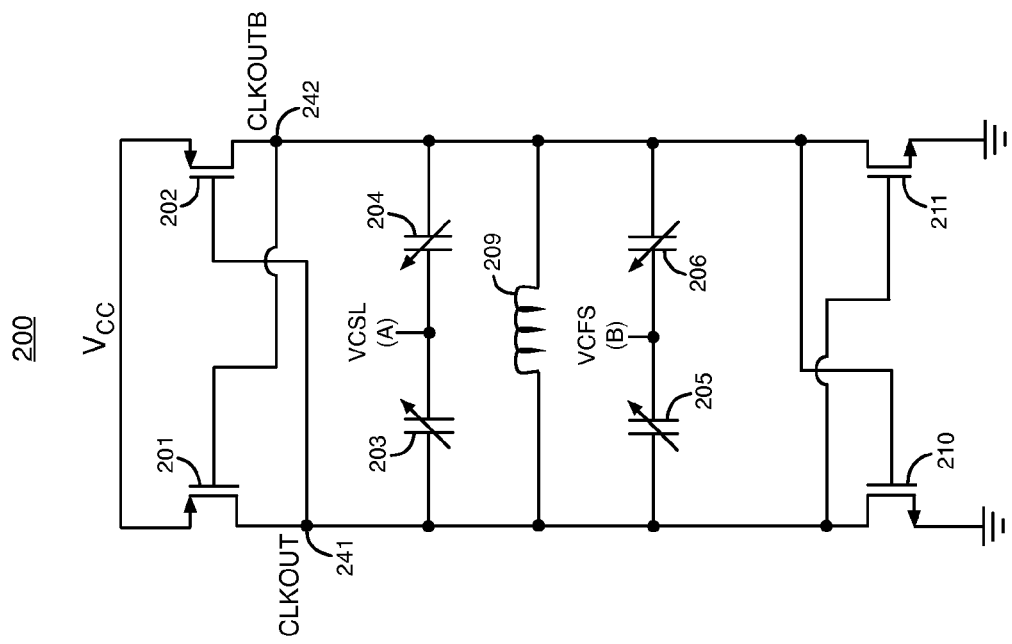
FIG. 2 illustrates an example of a voltage-controlled oscillator that can be used in the PLL shown in FIG. 1, according to an embodiment of the present invention.

FIG. 2 illustrates an example of a voltage-controlled oscillator 200 that can be used in PLL 100, according to an embodiment of the present invention. Voltage-controlled oscillator (VCO) 200 is an example of an oscillator structure that can be used to implement VCO 108 shown in FIG. 1 in PLL 100.

VCO 200 includes cross-coupled p-channel metal oxide semiconductor field-effect transistors (MOSFETs) 201-202, varactors 203-206, inductor 209, and cross-coupled n-channel MOSFETs 210-211. VCO 200 receives charge from supply voltage VCC. VCO 200 is coupled between a supply voltage terminal that is at supply voltage VCC and a ground terminal that is at a ground voltage.

Varactors 203-206 are capacitors that have variable capacitances. Varactors 203-206 can be, for example, reverse-biased diodes or MOS varactors. The capacitance of each varactor 203-206 varies in response to changes in the voltage across the varactor. The control voltage VCSL at the A input of the VCO is transmitted to a terminal of each of varactors 203 and 204, as shown in FIG. 2. The capacitances of varactors 203-204 vary in response to changes in VCSL. The control voltage VCFS at the B input of the VCO is transmitted to a terminal of each of varactors 205-206, as shown in FIG. 2. The capacitances of varactors 205-206 vary in response to changes in VCFS. The inductance of inductor 209 is constant.

VCO 200 is a resonant LC tank VCO circuit. The resonant LC tank is formed by varactors 203-206 and inductor 209. VCO 200 generates two periodic digital output clock signals CLKOUT and CLKOUTB at output nodes 241 and 242, respectively. Clock signals CLKOUT and CLKOUTB are 180° out of phase with each other. The cross-coupled p-channel transistors 201-202 and n-channel transistors 210-211 compensate for the resistive losses of inductor 209 and varactors 203-206. As a result, transistors 201-202 and 210-211 cause the output clock signals CLKOUT and CLKOUTB of the LC tank to continue oscillating without attenuation as long as current continues to be supplied from VCC. Transistors 201-202 and 210-211 turn on and off in response to the pulses in clock signals CLKOUT and CLKOUTB.

The frequency range of the output clock signals CLKOUT and CLKOUTB of VCO 200 is shown in equations (2) and (3).

$$F_{OSC,MIN} < F_{OSC} < F_{OSC,MAX} \qquad (2)$$

$$\frac{1}{\sqrt{LC_{VAR,MAX}}} < 2\pi \times F_{OSC} < \frac{1}{\sqrt{LC_{VAR,MIN}}} \qquad (3)$$

In equation (2), $F_{OSC}$ is the oscillating frequency of CLKOUT and CLKOUTB, $F_{OSC,MIN}$ refers to the minimum oscillating frequency of CLKOUT and CLKOUTB, and $F_{OSC,MAX}$ refers to the maximum oscillating frequency of CLKOUT and CLKOUTB. In equation (3), L is the inductance of inductor

209, $C_{VAR,MAX}$ is the maximum capacitance of varactors 203-206, and $C_{VAR,MIN}$ is the minimum capacitance of varactors 203-206.

VCO 200 locates the oscillating frequency of CLKOUT and CLKOUTB as the capacitances of the varactors 203-206 are tuned by the control voltages VCSL and VCFS. Thus, the frequency of CLKOUT and CLKOUTB varies in response to changes in one or both of the control voltages VCSL and VCFS.

Figure 3:
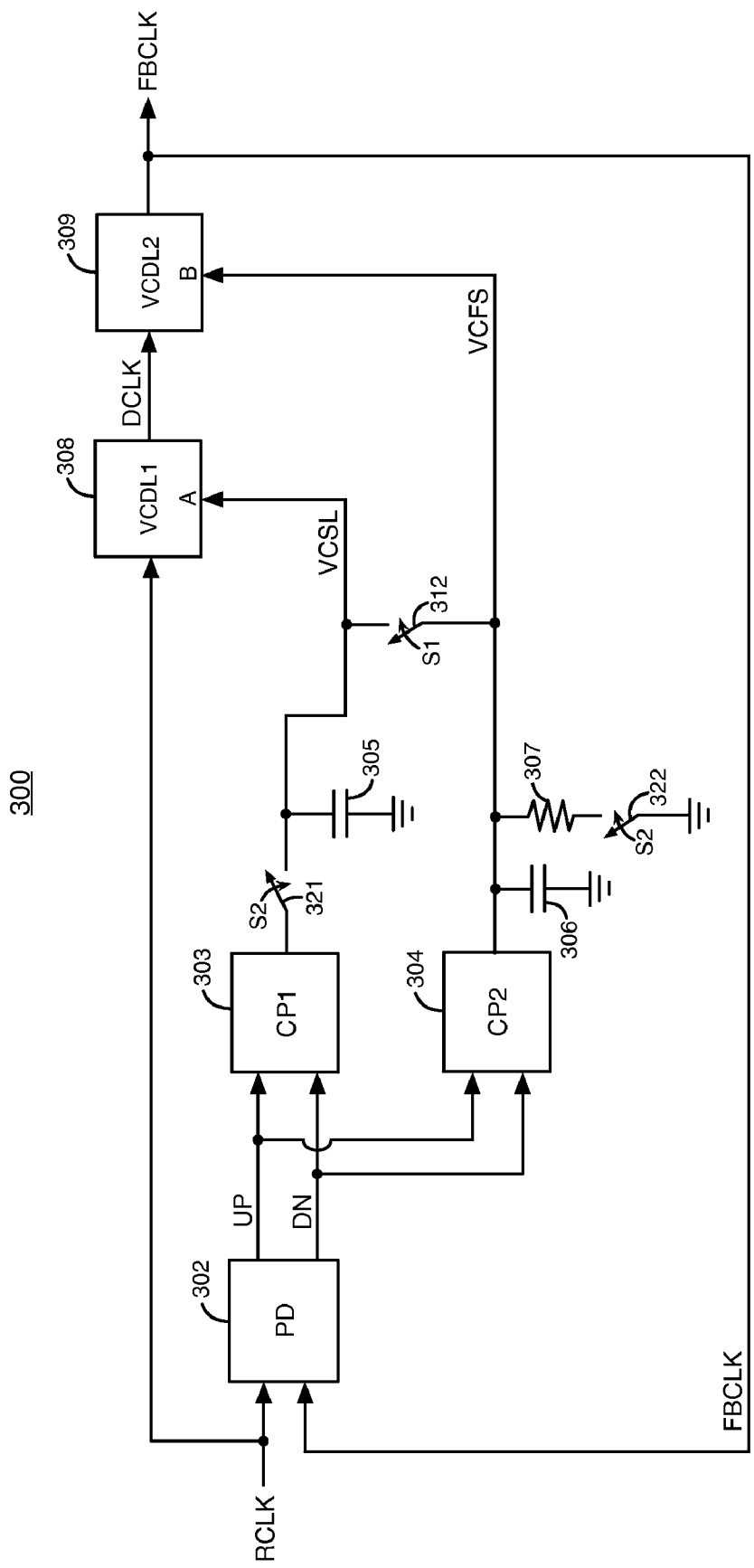
FIG. 3 illustrates an example of a configurable dual path delay-locked loop (DLL) circuit, according to an embodiment of the present invention.

FIG. 3 illustrates an example of a configurable dual path delay-locked loop (DLL) circuit 300, according to an embodiment of the present invention. DLL 300 includes a phase detector (PD) circuit 302, charge pump (CP) circuits 303-304, capacitors 305-306, resistor 307, voltage-controlled delay line (VCDL) circuits 308-309, and switch circuits 312 and 321-322. DLL 300 is typically fabricated on an integrated circuit, such as an ASIC or a programmable logic integrated circuit.

Phase detector (PD) 302 compares the phase of a feedback clock signal FBCLK to the phase of an input reference clock signal RCLK. PD 302 generates pulses in UP and DN output phase error signals that vary in duration based on the difference between the phases of RCLK and FBCLK. RCLK and FBCLK have the same frequency.

DLL 300 has an integral path and a proportional path. The integral path includes charge pump 303, capacitor 305, and VCDL 308. The proportional path includes charge pump 304, capacitor 306, resistor 307, and VCDL 309.

The conductive state of switch circuit 312 is controlled by switch control signal S1. The conductive states of switch circuits 321-322 are controlled by switch control signal S2. Switch control signals S1 and S2 are driven to opposite logic states.

DLL 300 can be configured as a single path DLL or as a dual path DLL. The conductive states of switch circuits 312 and 321-322 determine whether DLL 300 is configured as a single path DLL or a dual path DLL.

When switch control signal S1 is in a logic high state, and switch control signal S2 is in a logic low state, switch circuit 312 is closed, switch circuits 321-322 are open, and DLL 300 is configured as a single path DLL. DLL 300 has only one path through its feedback loop when it is configured as a single path DLL. The output of charge pump 304 is coupled to the B input of VCDL 309. The output of charge pump 304 is also coupled to the A input of VCDL 308 through switch circuit 312. Resistor 307 is decoupled from ground, and the output of charge pump 303 is decoupled from capacitor 305.

The operation of DLL 300 is now described when DLL 300 is configured as a single path DLL. The UP and DN signals are transmitted to inputs of charge pump 304. Charge pump 304 generates a control voltage in response to the UP and DN signals. The control voltage is provided to the A control input of VCDL 308 and to the B control input of VCDL 309. VCDL 308 delays reference clock signal RCLK to generate a delayed clock signal DCLK. VCDL 308 varies the delay provided to clock signal DCLK relative to clock signal RCLK in response to changes in the control output voltage of charge pump 304. VCDL 309 delays clock signal DCLK to generate the feedback clock signal FBCLK. VCDL 309 varies the delay provided to clock signal FBCLK relative to clock signal DCLK in response to changes in the control output voltage of charge pump 304. DLL 300 drives the phase difference between RCLK and FBCLK to zero by varying the delays of VCDL circuits 308 and 309 using the single path through charge pump 304.

When switch control signal S1 is in a logic low state, and switch control signal S2 is in a logic high state, switch circuit 312 is open, switch circuits 321-322 are closed, and DLL 300 is configured as a dual path DLL. The output of charge pump 304 is coupled to the B input of VCDL 309. The output of charge pump 303 is coupled to the A input of VCDL 308 through switch circuit 321. Resistor 307 is coupled to ground through switch circuit 322. Switch circuit 312 decouples the A and B control inputs of VCDL circuits 308 and 309 from each other. When DLL 300 is configured as a dual path DLL, the integral path through charge pump 303 drives the A input of VCDL 308, and the proportional path through charge pump 304 drives the B input of VCDL 309.

The operation of DLL 300 is now described for when DLL 300 is configured as a dual path DLL. Capacitor 305 functions as a low pass filter for the integral path. Capacitor 306 and resistor 307 function as a low pass filter for the proportional path. Capacitor 305 is larger than capacitor 306, and charge pump 304 generates a larger output current than charge pump 303. As a result, the integral path is a slow signal path, and the proportional path is a fast signal path.

The UP and DN signals are transmitted to inputs of charge pumps 303 and 304. Charge pump 303 generates control voltage VCSL and charge pump 304 generates control voltage VCFS in response to the UP and DN signals. Control voltage VCSL is provided to the A control input of VCDL 308, and control voltage VCFS is provided to the B control input of VCDL 309. VCDL 308 varies the delay provided to clock signal DCLK relative to clock signal RCLK in response to changes in control voltage VCSL. VCDL 309 varies the delay provided to feedback clock signal FBCLK relative to clock signal DCLK in response to changes in control voltage VCFS.

PD 302 generates logic high pulses in the UP signal that are longer than the logic high pulses in the DN signal when the phase of FBCLK occurs more than one period (or more than multiple periods) after the phase of RCLK. When logic high pulses in the UP signal are longer than logic high pulses in the DN signal, charge pumps 303 and 304 increase control voltages VCSL and VCFS, respectively. When control voltages VCSL and VCFS increase, delay lines 308 and 309 decrease the delay provided to FBCLK relative to RCLK, causing the phase of FBCLK to occur earlier in time.

PD 302 generates logic high pulses in the DN signal that are longer than the logic high pulses in the UP signal when the phase of FBCLK occurs less than one period (or less than multiple periods) after the phase of RCLK. When logic high pulses in the DN signal are longer than logic high pulses in the UP signal, charge pumps 303 and 304 decrease control voltages VCSL and VCFS, respectively. When control voltages VCSL and VCFS decrease, delay lines 308 and 309 increase the delay provided to FBCLK relative to RCLK, causing the phase of FBCLK to occur later in time.

When RCLK and FBCLK are aligned in phase (e.g., separated by one period), PD 302 generates logic high pulses in the UP and DN signals that have the same duration. When the pulses in the UP and DN signals have the same duration, charge pumps 303 and 304 maintain control voltages VCSL and VCFS, respectively, at constant voltages. When VCSL and VCFS are constant, delay lines 308-309 maintain the phase of FBCLK constant. DLL 300 is in lock when RCLK and FBCLK are aligned (or nearly aligned) in phase.

When the phases of clock signals RCLK and FBCLK are relatively far apart, charge pump 304 varies the voltage of VCFS more than charge pump 303 varies the voltage of VCSL, and variations in the delay provided to FBCLK are predominately caused by changes in VCFS. When the phases of clock signals RCLK and FBCLK are closer to being aligned, charge pump 303 varies the voltage of VCSL more than charge pump 304 varies the voltage of VCSF, and variations in the delay provided to FBCLK are predominately caused by changes in VCSL.

When DLL 300 is configured as a dual path DLL, the following equations (4)-(6) apply to VCDL circuits 308-309. In equations (4)-(6), $t_{DL1}$ is the delay of VCDL 308, $t_{DL2}$ is the delay of VCDL 309, $t_{TOTAL}$ is the combined delay of VCDL 308 and VCDL 309, $t_{o1}$ is the minimum delay of VCDL 308, $t_{o2}$ is the minimum delay of VCDL 309, $K_{DL1}$ is the gain of VCDL 308 (i.e., the delay change of VCDL 308 per change in control voltage VCSL), $K_{DL2}$ is the gain of VCDL 309 (i.e., the delay change of VCDL 309 per change in control voltage VCFS), $K_{DL1} > K_{DL2}$, and the total gain $K_{DL}$ of VCDL circuits 308-309 equals $K_{DL1} + K_{DL2}$.

$$t_{DL1} = t_{o1} + (K_{DL1} \times VCSL) \quad (4)$$

$$t_{DL2} = t_{o2} + (K_{DL2} \times VCFS) \quad (5)$$

$$t_{TOTAL} = t_{DL1} + t_{DL2} \quad (6)$$

Figure 4:
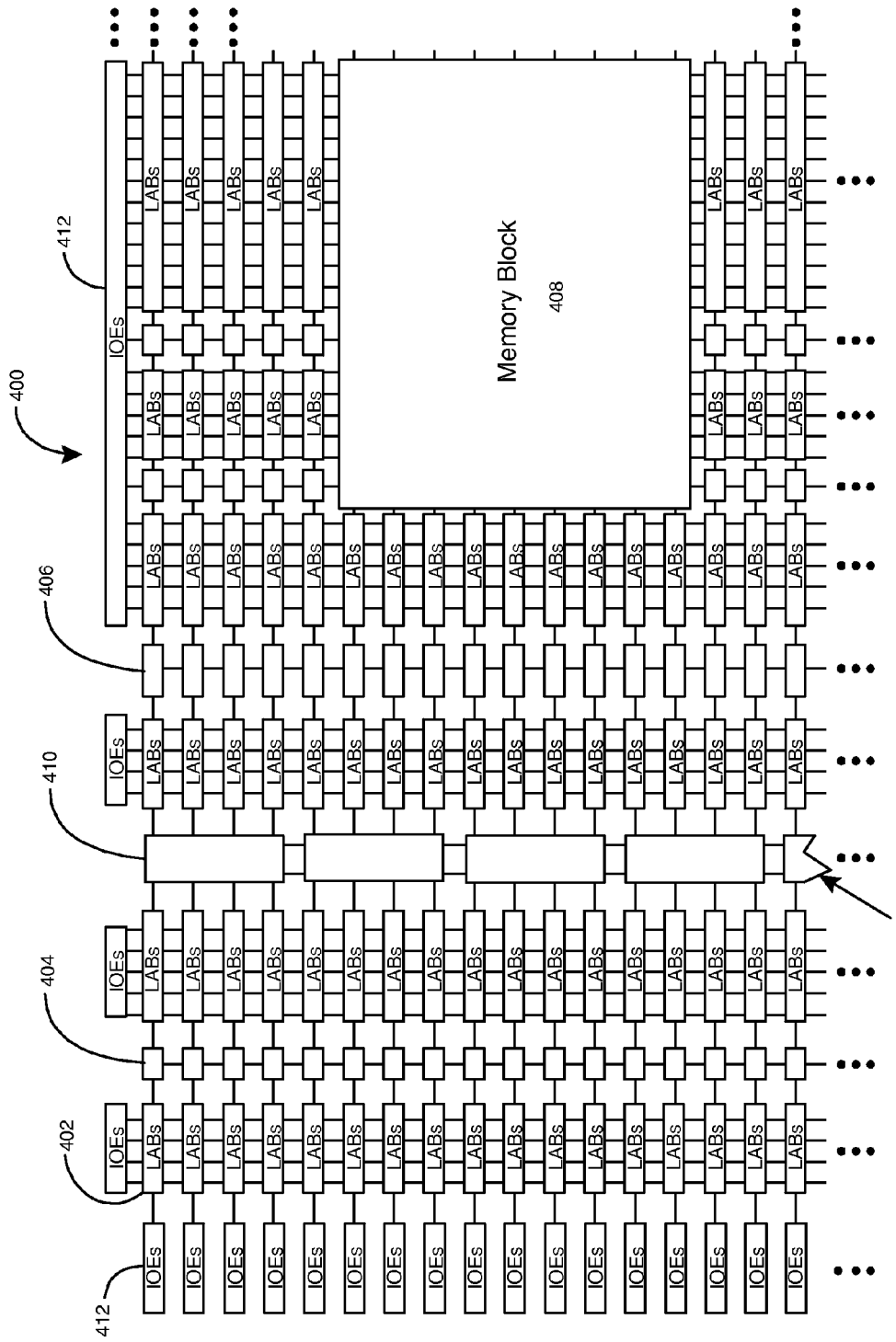
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 400 includes a two-dimensional array of programmable logic array blocks (or LABs) 402 that are interconnected by a network of column and row interconnect conductors of varying length and speed. LABs 402 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 located, in this example, around the periphery of the chip, support numerous single-ended and differential input/output standards. IOEs 412 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 400 is described herein for illustrative purposes only and that the present invention can be implemented in many different types of integrated circuits.

Figure 5:
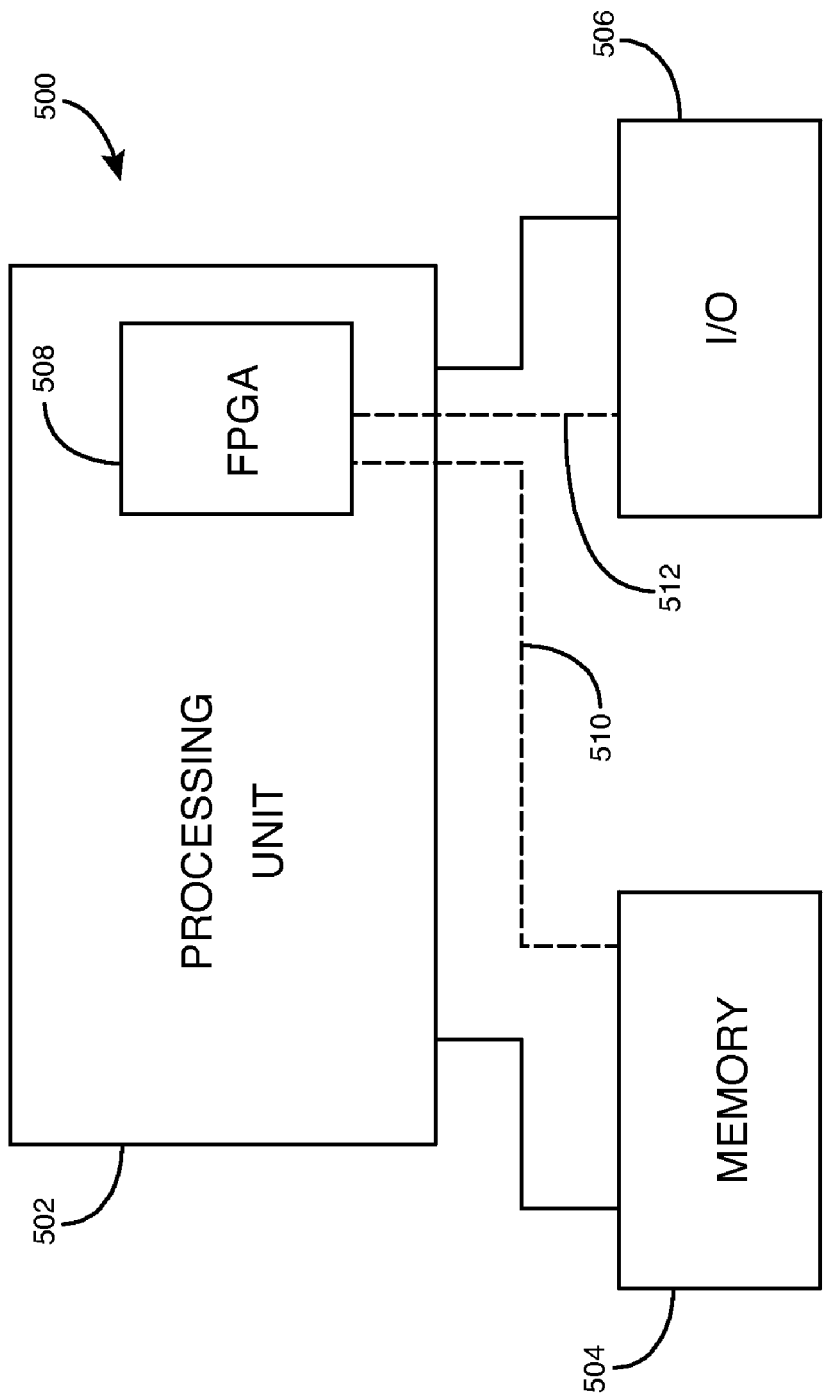
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor that can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A feedback loop circuit comprising:
a phase detector;
first and second charge pumps that are each responsive to an output signal of the phase detector;
a first low pass filter;
a second low pass filter coupled to an output of the second charge pump;
a clock signal generation circuit having first and second control inputs;
a first switch circuit coupled between the first low pass filter and the second low pass filter; and
a second switch circuit coupled to the first low pass filter and the first control input of the clock signal generation circuit.

2. The feedback loop circuit of claim 1 further comprising:
a third switch circuit coupled between the output of the second charge pump and the first control input of the clock signal generation circuit.

3. The feedback loop circuit of claim 2 further comprising:
a fourth switch circuit coupled between the second low pass filter and a ground node.

4. The feedback loop circuit of claim 3 further comprising:
a fifth switch circuit coupled between an output of the first charge pump and the first low pass filter, wherein the second switch circuit is coupled between the first low pass filter and the first control input of the clock signal generation circuit.

5. The feedback loop circuit of claim 4, wherein conductive states of the first and the third switch circuits are controlled by a first control signal, wherein conductive states of the second, the fourth, and the fifth switch circuits are controlled by a second control signal, and wherein the feedback loop circuit is configurable to function as a single path phase-locked loop or as a dual path phase-locked loop by selecting states of the first and the second control signals.

6. The feedback loop circuit of claim 1, wherein the output of the second charge pump is coupled to the second control input of the clock signal generation circuit and wherein an output of the first charge pump is coupled to the first low pass filter and to the first control input of the clock signal generation circuit when the feedback loop circuit is configured to function as a dual path phase-locked loop, and wherein the output of the first charge pump is decoupled from the clock signal generation circuit when the feedback loop circuit is configured to function as a single path phase-locked loop.

7. The feedback loop circuit of claim 1, wherein the feedback loop circuit is in a programmable logic integrated circuit.

8. The feedback loop circuit of claim 1, wherein the clock signal generation circuit is an oscillator circuit that comprises first and second varactors coupled to the first control input, third and fourth varactors coupled to the second control input, and an inductor coupled to the first, the second, the third, and the fourth varactors.

9. The feedback loop circuit of claim 1 wherein the feedback loop circuit is a delay-locked loop circuit further comprising:
a third switch circuit coupled between the second low pass filter and a ground node, wherein the clock signal generation circuit comprises a first voltage-controlled delay line having the first control input and a second voltage-controlled delay line having the second control input.

10. A feedback loop circuit comprising:
a phase detector;
first and second charge pumps that are each responsive to an output signal of the phase detector;
a first low pass filter;
a second low pass filter coupled to an output of the second charge pump; and
a clock signal generation circuit having first and second control inputs,
wherein the output of the second charge pump is coupled to the second control input of the clock signal generation circuit, wherein an output of the first charge pump is coupled to the first low pass filter and to the first control input of the clock signal generation circuit when the feedback loop circuit is configured to function as a dual path feedback loop, and wherein the output of the first charge pump is decoupled from the clock signal generation circuit when the feedback loop circuit is configured to function as a single path feedback loop; and
a first switch circuit coupled between the first low pass filter and the second low pass filter.

11. The feedback loop circuit of claim 10 further comprising:
a second switch circuit coupled between the output of the first charge pump and the first low pass filter.

12. The feedback loop circuit of claim 10, wherein the feedback loop circuit is a phase-locked loop, and wherein the clock signal generation circuit is an oscillator.

13. The feedback loop circuit of claim 10 wherein the feedback loop circuit is a delay-locked loop, and wherein the clock signal generation circuit comprises a first voltage-controlled delay line having the first control input and a second voltage-controlled delay line having the second control input.

14. A feedback loop circuit comprising:
a phase detector;
first and second charge pumps that are each responsive to an output signal of the phase detector;
a first low pass filter;
a second low pass filter coupled to an output of the second charge pump;
a clock signal generation circuit having first and second control inputs,
wherein the output of the second charge pump is coupled to the second control input of the clock signal generation circuit, wherein an output of the first charge pump is coupled to the first low pass filter and to the first control input of the clock signal generation circuit when the feedback loop circuit is configured to function as a dual path feedback loop, and wherein the output of the first charge pump is decoupled from the clock signal generation circuit when the feedback loop circuit is configured to function as a single path feedback loop; and
a first switch circuit coupled between the output of the second charge pump and the first control input of the clock signal generation circuit.

15. The feedback loop circuit of claim 14 further comprising:
a second switch circuit coupled between the output of the first charge pump and the first low pass filter; and
a third switch circuit coupled between the second low pass filter and a ground node.

16. The feedback loop circuit of claim 15 further comprising:
a fourth switch circuit coupled between the first low pass filter and the first control input of the clock signal generation circuit; and
a fifth switch circuit coupled between the first low pass filter and the second low pass filter, wherein the clock signal generation circuit is an oscillator circuit, and the feedback loop circuit is a phase-locked loop circuit.

17. The feedback loop circuit of claim 16, wherein conductive states of the first and the fifth switch circuits are controlled by a first control signal, and wherein conductive states of the second, the third, and the fourth switch circuits are controlled by a second control signal.

18. A method for generating a periodic signal using a feedback loop, the method comprising:
comparing phases of first and second periodic signals to generate a phase comparison signal;
generating first and second filtered control signals in response to the phase comparison signal respectively using first and second paths through the feedback loop;
generating the second periodic signal in response to the first and the second filtered control signals when the feedback loop is configured in a dual path mode by coupling the first filtered control signal to a first control input of a clock signal generation circuit in response to a first switch signal; and generating the second periodic signal in response to the second filtered control signal when the feedback loop is configured in a single path mode by decoupling the first filtered control signal from the clock signal generation circuit in response to the first switch signal and coupling the second filtered control signal to the first control input of the clock signal generation circuit in response to a second switch signal.

19. The method of claim 18, wherein generating the second periodic signal in response to the first and the second filtered control signals when the feedback loop is configured in a dual path mode further comprises coupling a resistor in a first filter to a ground node in response to the first switch signal, wherein the first filter is operable to filter the second filtered control signal.

20. The method of claim 19, wherein generating the second periodic signal in response to the second filtered control signal when the feedback loop is configured in a single path mode further comprises coupling the resistor to a capacitor in a second filter.

21. A feedback loop circuit comprising:
a phase detector;
first and second charge pumps that are each responsive to an output signal of the phase detector;
a first low pass filter;
a second low pass filter coupled to an output of the second charge pump;
a clock signal generation circuit having first and second control inputs,
wherein the second charge pump is coupled to the second control input of the clock signal generation circuit, wherein a control signal generated by the first charge pump and filtered by the first low pass filter is provided to the first control input of the clock signal generation circuit when the feedback loop circuit is configured as a dual path feedback loop, and wherein the first charge pump is decoupled from the clock signal generation circuit when the feedback loop circuit is configured as a single path feedback loop; and
a first switch circuit coupled between the second low pass filter and a ground node.

22. The feedback loop circuit of claim 21 further comprising:
a second switch circuit coupled between an output of the first charge pump and the first low pass filter.

* * * * *